(12) United States Patent
Takano et al.

(10) Patent No.: US 10,736,208 B2
(45) Date of Patent: Aug. 4, 2020

(54) PRINTED WIRING BOARD FOR HIGH FREQUENCY TRANSMISSION

(71) Applicant: NIPPON MEKTRON, LTD., Tokyo (JP)

(72) Inventors: Shoji Takano, Tokyo (JP); Yoshihiko Narisawa, Tokyo (JP); Fumihiko Matsuda, Tokyo (JP)

(73) Assignee: NIPPON MEKTRON, LTD., Tokyo (JP)

( * ) Notice: Subject to any disclaimer, the term of this patent is extended or adjusted under 35 U.S.C. 154(b) by 0 days.

(21) Appl. No.: 16/490,611

(22) PCT Filed: Nov. 22, 2018

(86) PCT No.: PCT/JP2018/043285
§ 371 (c)(1),
(2) Date: Sep. 3, 2019

(87) PCT Pub. No.: WO2019/116860
PCT Pub. Date: Jun. 20, 2019

(65) Prior Publication Data
US 2020/0015351 A1    Jan. 9, 2020

(30) Foreign Application Priority Data

Dec. 14, 2017    (JP) .................................. 2017-239767

(51) Int. Cl.
*H05K 1/02*    (2006.01)
*H05K 1/11*    (2006.01)
(Continued)

(52) U.S. Cl.
CPC ............. *H05K 1/0237* (2013.01); *H01P 3/08* (2013.01); *H01P 11/003* (2013.01);
(Continued)

(58) Field of Classification Search
CPC ...... H05K 1/0237; H05K 1/115; H05K 1/116; H05K 3/4644
See application file for complete search history.

(56) References Cited

U.S. PATENT DOCUMENTS

2012/0274423 A1    11/2012    Kato
2015/0018055 A1*   1/2015    Yosui ...................... H05K 1/02
                                                                  455/575.1

FOREIGN PATENT DOCUMENTS

JP          2724103 B2      3/1998
JP       2004-221400 A      8/2004
(Continued)

OTHER PUBLICATIONS

International Search Report issued in in PCT/JP2018/043285; dated Feb. 19, 2019.

*Primary Examiner* — Timothy J Thompson
*Assistant Examiner* — Amol H Patel
(74) *Attorney, Agent, or Firm* — Studebaker & Brackett PC

(57) ABSTRACT

A printed wiring board 1 for high frequency transmission according to an embodiment of the present invention includes: an insulating base material 10; a signal line 21 extending in a longitudinal direction of the insulating base material 10; ground wirings 31, 32 extending in the longitudinal direction while being spaced apart from the signal line 21 by a predetermined distance; a ground layer 40 formed on a major surface 10b; a plurality of ground connection vias 51 electrically connecting the ground wiring 31 and the ground layer 40; and a plurality of ground connection vias 52 electrically connecting the ground wiring 32 and the ground layer 40. A width of the ground wirings 31, 32 is smaller than a land diameter of the ground connection vias 51, 52. Then, the ground connection vias 51 and the ground connection vias 52 are arranged not to (Continued)

overlap each other in a width direction perpendicular to the longitudinal direction throughout a cable portion 90.

18 Claims, 17 Drawing Sheets

(51) Int. Cl.
    *H05K 1/03*          (2006.01)
    *H05K 3/46*          (2006.01)
    *H01P 3/08*          (2006.01)
    *H01P 11/00*        (2006.01)
    *H01Q 1/22*         (2006.01)

(52) U.S. Cl.
    CPC ........... *H01Q 1/2283* (2013.01); *H05K 1/028* (2013.01); *H05K 1/0393* (2013.01); *H05K 1/115* (2013.01); *H05K 3/4644* (2013.01); *H05K 2201/0141* (2013.01); *H05K 2201/093* (2013.01); *H05K 2201/09227* (2013.01); *H05K 2201/09609* (2013.01)

(56) References Cited

FOREIGN PATENT DOCUMENTS

| | | |
|---|---|---|
| JP | 2006-024618 A | 1/2006 |
| JP | 2008-135298 A | 6/2008 |
| JP | 2010-028306 A | 2/2010 |
| WO | 2012/073591 A1 | 6/2012 |

\* cited by examiner

FIG. 7
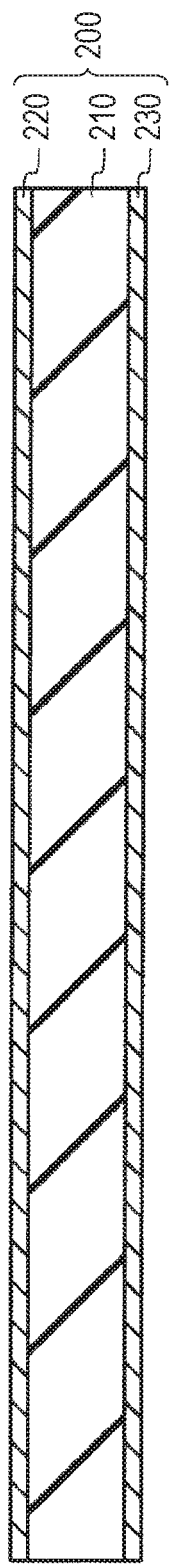
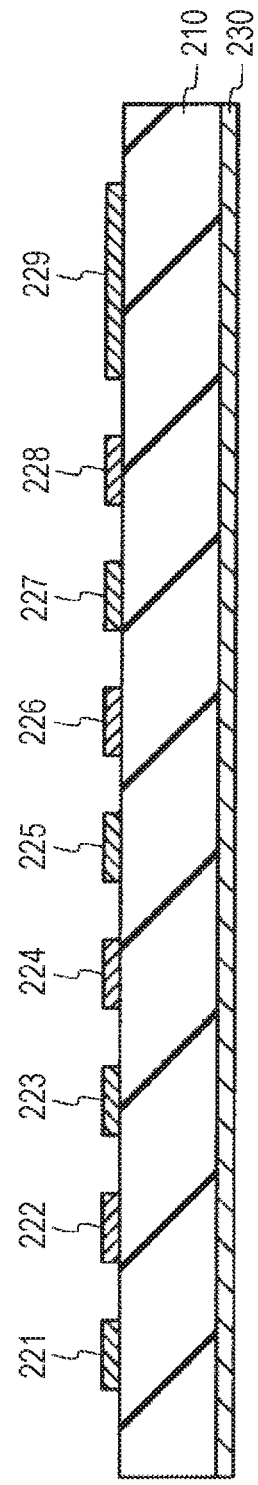
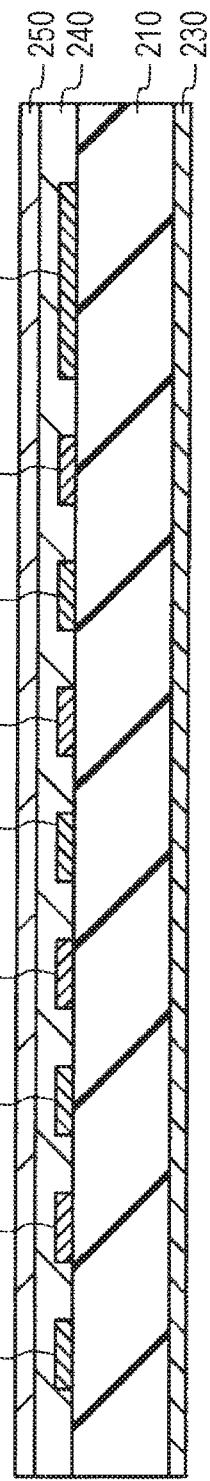

PRINTED WIRING BOARD FOR HIGH FREQUENCY TRANSMISSION

TECHNICAL FIELD

The present invention relates to a printed wiring board for high frequency transmission.

BACKGROUND ART

An information processing terminal such as a smartphone, a tablet terminal, and a mobile phone includes an antenna for communicating with another device and a substrate having electronic components such as a semiconductor chip mounted thereon. The antenna and the substrate are connected by a thin coaxial cable through a small coaxial connector. In recent years, with further increase in communication speed, an increase in speed of digital signals is progressing. Further, in order to use various frequency bands, a plurality of antennas is provided in the information processing terminal.

PATENT LITERATURE 1 describes a printed wiring board having high density wiring. In this printed wiring board, GND-VIA holes are arranged in a staggered manner in adjacent GND wirings.

PATENT LITERATURE 2 describes a flexible printed wiring board used for transmission of an electrical signal. In the flexible printed wiring board, a plurality of ground line patterns and signal line patterns extending in parallel with each other while being bent in a zigzag manner in a longitudinal direction of an insulating material strip are arranged on an upper surface d a lower surface of the insulating material strip. Then, the ground line pattern on the lower surface intersects the ground line pattern on the upper surface in plan view. At the intersection, the ground line patterns on the upper and lower surfaces are electrically connected to each other through through-holes.

CITATION LIST

Patent Literature

PATENT LITERATURE 1: JP-A-2004-221400
PATENT LITERATURE 2: Japanese Patent No. 2724103

SUMMARY OF THE INVENTION

Problems to be Solved by the Invention

As described above, the number of cases where a plurality of antennas is provided in the information processing terminal such as the smartphone is increasing. Therefore, it is necessary to use many thin coaxial cables connecting the antennas and the substrate. However, although the thin coaxial cable has a small diameter, a number of cables corresponding to the number of antennas is required. From this, the thin coaxial cables occupy space in the information processing terminal. Therefore, there is a demand for a transmission line that has a plurality of signal lines but can be housed in a narrow space.

Therefore, it is conceivable to connect the antennas and the substrate by using the printed wiring board such as the flexible printed wiring board instead of the thin coaxial cable. FIG. 16 shows a part of a cable portion of the printed wiring board for high frequency transmission according to a comparative example. The cable portion is a portion in which the signal line extending in a longitudinal direction thereof includes the printed wiring board for high frequency transmission. FIG. 17 is a cross-sectional view taken along line II-II of FIG. 16. Note that none of an insulating base material 1020, a ground layer 5000, and an adhesive layer 1030 are shown in FIG. 16.

In the printed wiring board for high frequency transmission according to the comparative example, signal lines 2100, 2200, 2300, 2400, which are signal transmission paths between the antennas and the substrate, are provided in parallel at equal intervals. Ground wirings 3100, 3200, 3300, 3400, 3500 are provided to sandwich the signal lines. The signal lines 2100 to 2400 and the ground wirings 3100 to 3500 are formed on an insulating base material 1010.

The insulating base material 1010 and the insulating base material 1020 are bonded together by the adhesive layer 1030. A ground layer 4000 is provided on an outer major surface of the insulating base material 1010. Similarly, a ground layer 5000 is provided on an outer major surface of the insulating base material 1020.

As shown in FIGS. 16 and 17, ground connection vias 6100 to 6500 are provided at equal intervals in the ground wirings 3100 to 3500 as interlayer connection vias. A width of the ground wirings 3100 to 3500 is approximately equal to a land diameter of the ground connection vias 6100 to 6500. The land diameter is larger than a via diameter of the ground connection vias 6100 to 6500 by a predetermined width.

As shown in FIG. 17, the ground connection via 6100 electrically connects the ground wiring 3100 to the ground layers 4000 and 5000. Similarly, the ground connection via 6200 electrically connects the ground wiring 3200 to the ground layers 4000 and 5000. The ground connection via 6300 electrically connects the ground wiring 3300 to the ground layers 4000 and 5000. The ground connection via 6400 electrically connects the ground wiring 3400 to the ground layers 4000 and 5000. Then, the ground connection via 6500 electrically connects the ground wiring 3500 to the ground layers 4000 and 5000.

As shown in FIG. 16, the ground connection vias 6100 to 6500 are arranged to overlap each other in a width direction of the printed wiring board for high frequency transmission. That is, the ground connection vias 6100 to 6500 are arranged in a straight line in a direction perpendicular to a longitudinal direction of the printed wiring board for high frequency transmission. A width W of the cable portion of the printed wiring board for high frequency transmission is, for example, about 3.5 mm.

In order to further thin the printed wiring board for high frequency transmission according the comparative example, it is necessary to further narrow the width of the signal lines 2100 to 2400 and the width of the ground wirings 3100 to 3500. However, the width of the ground wirings 3100 to 3500 is limited by the land diameter of the ground connection vias 6100 to 6500. When the land diameter is reduced, connection reliability of the ground connection vias 6100 to 6500 may be reduced.

Note that in the printed wiring boards of PATENT LITERATURES 1 and 2, the ground connection vias overlap each other in the width direction in at least a partial region of the cable portion. Therefore, it is difficult to sufficiently reduce the width of the printed wiring board.

The printed wiring board for high frequency transmission of the present disclosure has been developed based on the above technical recognition. According to the embodiment of the present disclosure, it is possible to provide the printed wiring board for high frequency transmission capable of reducing the width of the printed wiring board for high frequency transmission while maintaining reliability of the ground connection vias.

Solution to the Problems

A printed wiring board for high frequency transmission according to the present invention includes: an insulating base material having a first major surface and a second major surface opposite to the first major surface, and extending in a longitudinal direction thereof; a signal line formed on the first major surface and extending in the longitudinal direction; a first ground wiring formed on the first major surface and extending in the longitudinal direction while being spaced apart from the signal line by a predetermined distance; a second ground wiring formed on an opposite side of the first ground wiring with the signal line interposed therebetween on the first major surface, and extending in the longitudinal direction while being spaced apart from the signal line by a predetermined distance; a ground layer formed on the second major surface; a plurality of first ground connection vias electrically connecting the first ground wiring and the ground layer; and a plurality of second ground connection vias electrically connecting the second ground wiring and the ground layer. A width of the first ground wiring is smaller than a land diameter of the first ground connection vias. A width of the second ground wiring is smaller a land diameter of the second ground connection vias. The first ground connection vias and the second ground connection vias are arranged not to overlap each other in a width direction perpendicular to the longitudinal direction throughout a cable portion.

Further, in the printed wiring board for high frequency transmission, the plurality of first ground connection vias may be arranged at first intervals in the longitudinal direction, the plurality of second ground connection vias may be arranged at second intervals in the longitudinal direction, and the first interval and the second interval may be shorter than a half wavelength of a signal flowing through the signal line.

Further, the printed wiring board for high frequency transmission may further include: a second signal line formed on an opposite side of the signal line with the second ground wiring interposed therebetween on the first major surface, and extending in the longitudinal direction while being spaced apart from the second ground wiring by a predetermined distance; a third ground wiring formed on an opposite side of the second ground wiring with the second signal line interposed therebetween on the first major surface, and extending in the longitudinal direction while being spaced apart from the second signal line by a predetermined distance; and a plurality of third ground connection vias electrically connecting the third ground wiring and the ground layer. A width of the third ground wiring may be smaller than a land diameter of the third ground connection vias. The first to third ground connection vias may be arranged not to overlap each other in the width direction perpendicular to the longitudinal direction throughout the cable portion.

Further, in the printed wiring board for high frequency transmission, a via region of the second ground wiring may have a planar shape having one set of sides in the longitudinal direction and another set of sides in a direction intersecting the longitudinal direction.

Further, in the printed wiring board for high frequency transmission, the first to third ground connection vias may be arranged in a straight line in a direction obliquely intersecting the longitudinal direction.

Further, in the printed wiring board for high frequency transmission, a signal of a first frequency may be input to the signal line, a signal of a second frequency lower than the first frequency may be input to the second signal line, the plurality of first ground connection vias may be arranged at first intervals in the longitudinal direction, the plurality of second ground connection vias may be arranged at second intervals in the longitudinal direction, the plurality of third ground connection vias may be arranged at third intervals in the longitudinal direction, the first interval and the second interval may be shorter than a half wavelength of the signal of the first frequency, and the third interval may be shorter than a half wavelength of the signal of the second frequency and longer than the first and second intervals.

Further, the printed wiring board for high frequency transmission may further include a second signal line formed between the signal line and the second ground wiring on the first major surface, and extending in the longitudinal direction while being spaced apart from the signal line by a first distance and spaced apart from the second ground wiring by a second distance.

Further, the printed wiring board for high frequency transmission may further include: a second insulating base material having a third major surface, and a fourth major surface opposite to the third major surface, extending in the longitudinal direction, and bonded to the insulating base material through an adhesive layer so that the third major surface faces the first major surface and a second ground layer formed on the fourth major surface. The first ground connection via electrically may connect the first ground wiring and the second ground layer, and the second ground connection via electrically may connect the second ground wiring and the second ground layer.

Further, in the printed wiring board for high frequency transmission, the insulating base material may have flexibility.

Further, in the printed wiring board for high frequency transmission, the insulating base material may include a liquid crystal polymer.

Further, the printed wiring board for high frequency transmission may further include a connector portion having a first connection pin electrically connected to the signal line, and a second connection pin electrically connected to the first and second ground wirings, and provided at an end of the cable portion.

Further, in the printed wiring board for high frequency transmission, a width of the connector portion may be larger than that of the insulating base material.

Effects of the Invention

In the printed wiring board for high frequency transmission according to the present embodiment, the width of the first ground wiring is smaller than the land diameter of the first ground connection via. Similarly, the width of the second ground wiring is smaller than the land diameter of the second ground connection via. The first ground connection via and the second ground connection via are arranged not to overlap each other in the width direction perpendicular to the longitudinal direction of the insulating base material throughout the cable portion. Thus, according to the present embodiment, it is possible to reduce the width of the printed wiring board for high frequency transmission while maintaining reliability of the ground connection vias.

BRIEF DESCRIPTION OF THE DRAWINGS

FIGS. 7(1) to 7(3) are process cross-sectional views for describing the method for manufacturing the printed wiring board for high frequency transmission according to the first embodiment following FIGS. 6(1) and 6(2).

DESCRIPTION OF THE EMBODIMENTS

Figure 1:
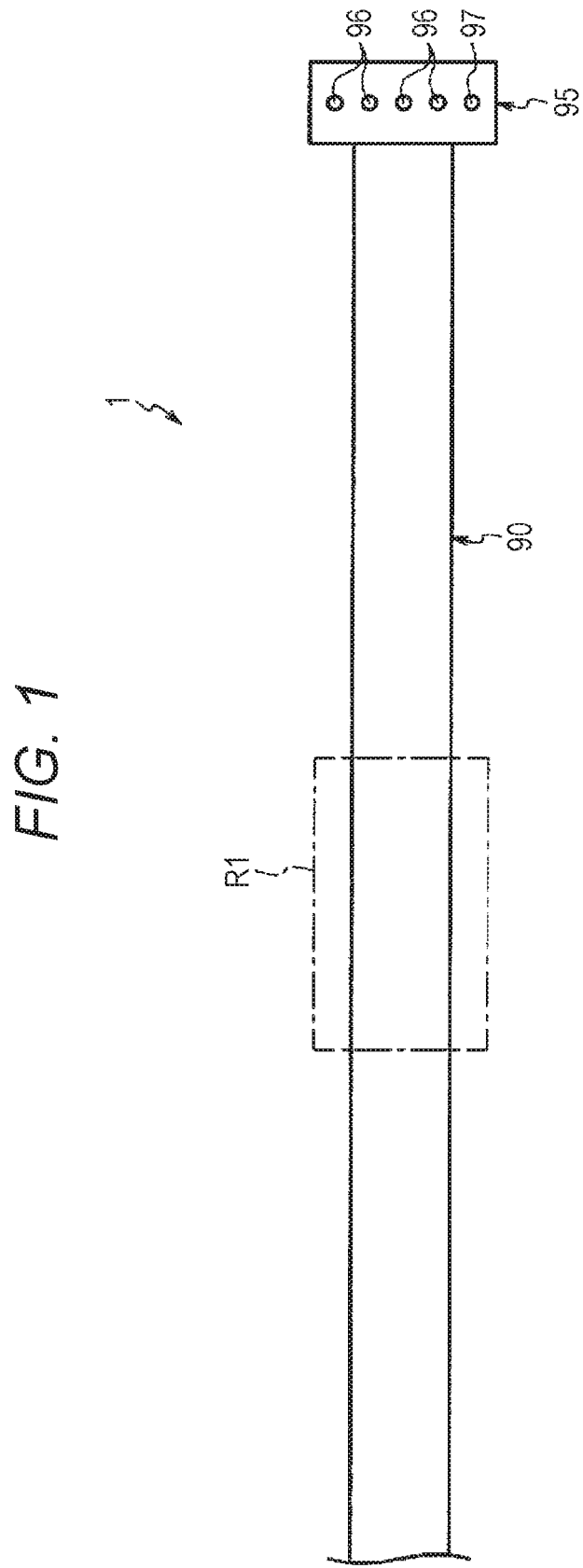
FIG. 1 is a plan view of a printed wiring board for high frequency transmission according to a first embodiment.

Hereinafter, embodiments according to the present disclosure will be described with reference to the drawings. Note that in the drawings, components having the same function are denoted by the same reference numerals. Further, the drawings are schematic drawings. A relationship between a thickness and a planar dimension of the components, a ratio of the thickness of each layer, and the like are different from an actual relationship, ratio, and the like.

First Embodiment

Figure 2:
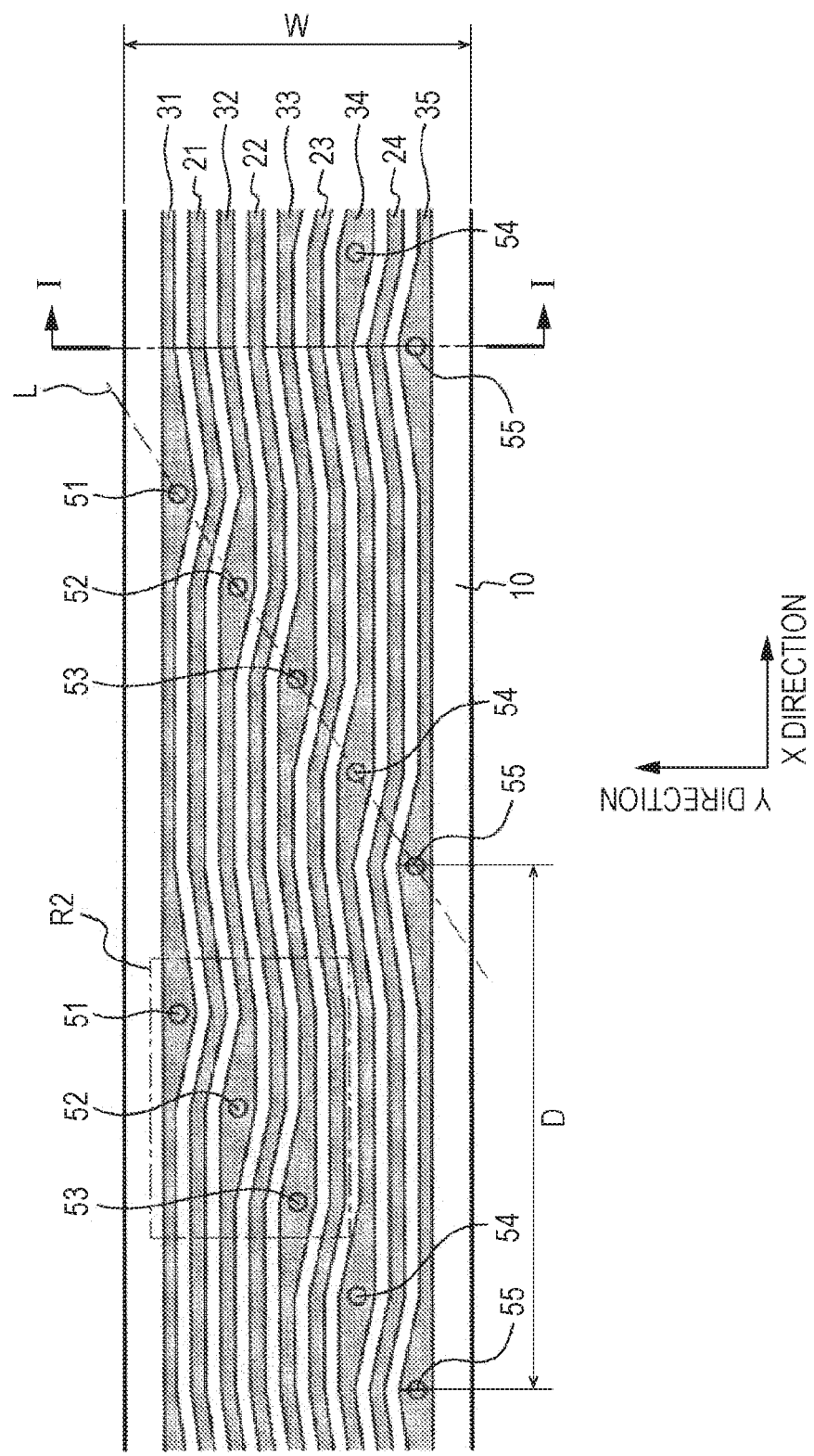
FIG. 2 is a plan view of an enlarged portion of a region R1 of FIG. 1.
Figure 3:
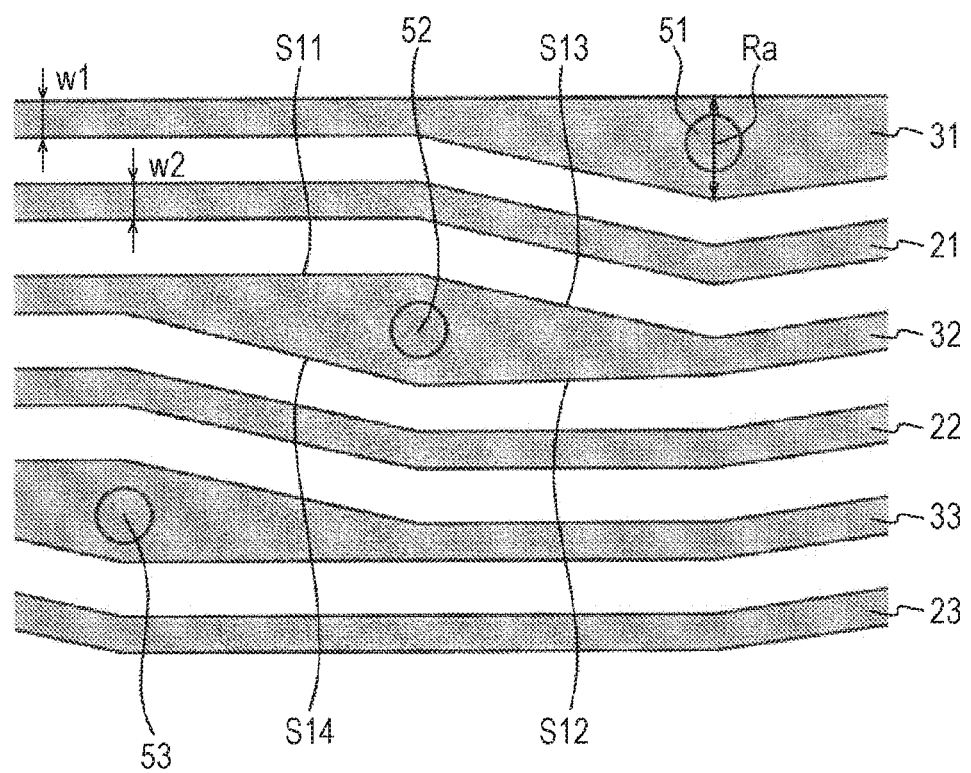
FIG. 3 is a plan view of an enlarged portion of a region R2 of FIG. 2.
Figure 4:
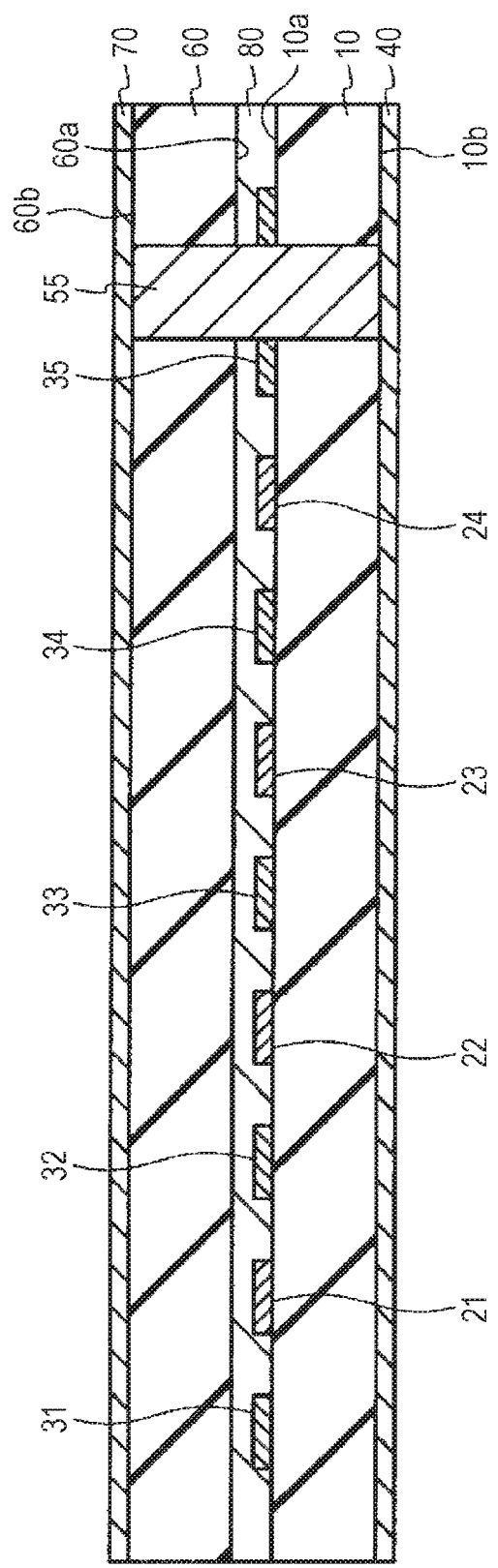
FIG. 4 is a cross-sectional view taken along line I-I of FIG. 2.

A structure of a printed wiring board for high frequency transmission according to a first embodiment will be described with reference to FIGS. 1 to 4. FIG. 1 is a plan view of a printed wiring board 1 for high frequency transmission according to the present embodiment. FIG. 2 is a plan view of an enlarged portion of a region R1 of FIG. 1. FIG. 3 is a plan view of an enlarged portion of a region R2 of FIG. 2. FIG. 4 is a cross-sectional view taken along line I-I of FIG. 2. Note that FIGS. 2 and 3 show none of an insulating base material 60, a ground layer 70, and an adhesive layer 80.

As shown in FIG. 1, the printed wiring board 1 for high frequency transmission includes an elongated strip-like cable portion 90 and a connector portion 95 provided at an end of the cable portion 90. As shown in FIG. 2, the cable portion 90 includes signal lines 21 to 24 extending in its longitudinal direction thereof. For example, signals in GHz band are input to the signal lines 21 to 24.

The connector portion 95 is provided at the end of the cable portion 90. The connector portion 95 is connected to, for example, a main substrate or an antenna. The connector portion 95 has connection pins 96 electrically connected to the signal lines 21 to 24 and a connection pin 97 electrically connected to ground wirings 31 to 35.

In the present embodiment, as shown in FIG. 1, a width of the connector portion 95 is larger than that of the cable portion 90 (that is, insulating base materials 10, 60). In other words, the cable portion 90 is formed to have a narrower width than the connector portion 95. A reference numeral W in FIG. 2 indicates the width of the cable portion 90. For example, the width W is about 2.5 mm.

Next, details of the cable portion 90 will be described.

As shown in FIGS. 2 and 4, the cable portion 90 of the printed wiring board 1 for high frequency transmission includes the insulating base materials 10, 60 extending in the longitudinal direction (X direction in FIG. 2), the signal lines 21, 22, 23, 24, the ground wirings 31, 32, 33, 34, 35, ground layers 40, 70, ground connection vias 51, 52, 53, 54, 55, and the adhesive layer 80. Note that although not shown, the ground layers 40, 70 may be covered with an insulating protective film.

As shown in FIG. 4, one side (upper side) of the signal lines 21 to 24 is covered with the ground layer 40 through the insulating base material 10. The other side (lower side) thereof is covered with the ground layer 70 through the insulating base material 60. Thus, the printed wiring board 1 for high frequency transmission according to the present embodiment can transmit high frequency signals in the same way as a coaxial cable.

Hereinafter, each component of the printed wiring board 1 for high frequency transmission will be described in detail.

As shown in FIG. 4, the insulating base material 10 has a major surface 10a and a major surface 10b opposite to the major surface 10a. The insulating base material 60 has a major surface 60a and a major surface 60b opposite to the major surface 60a. The insulating base material 60 is bonded to the insulating base material 10 through the adhesive layer 80 so that the major surface 60a faces the major surface 10a of the insulating base material 10.

A thickness of each of the insulating base materials 10, 60 is, for example, 100 μm. A thickness of the adhesive layer 80 is, for example, 25 μm. Note that the insulating base materials 10, 60 may contain a plurality of insulating base materials bonded to other.

The insulating base materials 10, 60 have flexibility in the present embodiment. Thus, the printed wiring board 1 for high frequency transmission can be easily disposed in a housing of an information processing terminal. For example, the insulating base materials 10, 60 are made of a liquid crystal polymer (Liquid Crystal Polymer: LCP). The liquid crystal polymer has a low dielectric constant and a low dielectric loss tangent (tan δ). Therefore, dielectric loss is small. As a result, transmission loss can be reduced.

Note that materials of the insulating base materials 10, 60 is not limited to LCP. A known material can be used as a base material of a flexible printed wiring board (FPC). Examples of applicable materials include polyamide, polyimide, polyethylene naphthalate (PEN), and polyethylene terephthalate (PET). Further, the insulating base materials 10, 60 may be produced from the material which does not have flexibility.

As shown in FIGS. 2 and 4, the signal lines 21 to 24 are formed on the major surface 10a of the insulating base material 10. The signal lines extend in the longitudinal direction of the cable portion 90 substantially parallel to each other. In the present application, "extending in the longitudinal direction" does not mean extending completely parallel in the longitudinal direction, but means extending in the longitudinal direction as a whole even while partially bending or curving.

A width of the signal lines 21 to 24 (see a width w2 in FIG. 3) is, for example, 130 μm. Note that the number of signal lines is not limited to four. The number of signal lines can be determined as appropriate. The number of signal lines may be one.

As shown in FIG. 2, the ground wirings 31 to 35 are formed on the major surface 10a of the insulating base material 10. The ground wirings 31 to 35 are alternately arranged with the signal lines 21 to 24. Note that the number of ground wirings 31 to 35 is not limited to five. For example, when the number of signal lines is one, two ground wirings may be provided to sandwich the signal line.

The ground wirings 31 to 35 extend in the longitudinal direction while being spaced apart from the signal lines 21 to 24 by a predetermined distance. The predetermined distance is determined such that a characteristic impedance of transmission path has a predetermined value (for example, 50Ω). The distance is, for example, 150 μm.

The width of the ground wirings 31 to 35 is, for example, 130 μm. Here, the width of the ground wiring 31 refers to a width (see a width w1 in FIG. 3) of a portion other than a region near the ground connection via 51 (hereinafter, also referred to as a "via region"). The width of the ground wiring 31 is smaller than that of the via region. The same applies to the widths of the other ground wirings 32 to 35.

The signal line 21 extends in the longitudinal direction while being spaced apart from the ground wiring 31 by a predetermined distance. The signal line 22 is formed on an opposite side of the signal line 21 with the ground wiring 32 interposed therebetween, and extends in the longitudinal direction while being spaced apart from the ground wiring 32 by a predetermined distance. The signal line 23 is formed on the opposite side of the signal line 22 with the ground wiring 33 interposed therebetween, and extends in the longitudinal direction while being spaced apart from the ground wiring 33 by a predetermined distance. The signal line 24 is formed on the opposite side of the signal line 23 with the ground wiring 34 interposed therebetween, and extends in the longitudinal direction while being spaced apart from the ground wiring 34 by a predetermined distance.

The ground wiring 31 extends in the longitudinal direction while being spaced apart from the signal line 21 by a predetermined distance. The ground wiring 32 is formed on the opposite side of the ground wiring 31 with the signal line 21 interposed therebetween, and extends in the longitudinal direction while being spaced apart from the signal line 21 by a predetermined distance. The ground wiring 33 is formed on the opposite side of the ground wiring 32 with the signal line 22 interposed therebetween, and extends in the longitudinal direction while being spaced apart from the signal line 22 by a predetermined distance. The ground wiring 34 is formed on the opposite side of the ground wiring 33 with the signal line 23 interposed therebetween, and extends in the longitudinal direction while being spaced apart from the signal line 23 by a predetermined distance. The ground wiring 35 is formed on the opposite side of the around wiring 34 with the signal line 24 interposed therebetween, and extends in the longitudinal direction while being spaced apart from the signal line 24 by a predetermined distance.

Note that as shown in FIG. 3, via regions of the ground connection vias 51 to 55 have a substantially parallelogram shape in plan view. For example, with respect to the ground connection via 52, as shown in FIG. 3, it has a parallelogram shape having one set of parallel sides S11 and S12 and another set of parallel sides S13 and S14. The same applies to the via regions of other ground connection vias sandwiched by the signal lines. As described above, since the via regions of the ground connection vias sandwiched by the signal lines have a substantially parallelogram shape, wiring density is increased. Further, the width of the printed wiring board 1 for high frequency transmission can be effectively reduced.

The ground layer 40 is a conductive layer example, copper foil) formed on the major surface 10b of the insulating base material 10. The ground layer 70 is the conductive layer (for example, copper foil) formed on the major surface 60b of the insulating base material 60. In the present embodiment, as shown in FIG. 4, the ground layer 40 covers the entire major surface 10b of the insulating base material. The ground layer 70 covers the entire major surface 60b of the insulating base material. Note that without being limited to this, the around layer 40 may be formed only in a partial region of the major surface 10b. Similarly, the ground layer 70 may be formed only in a partial region of the major surface 60b. Or, the ground layer 40 and/or the ground layer 70 may be patterned in a predetermined shape (mesh shape or the like).

The ground connection vias 51 to 55 electrically connect the ground layer 40, the ground wirings 31 to 35, and the ground layer 70 to one another. For example, as illustrated in FIG. 4, the ground connection via 55 electrically connects the ground layer 40, the ground wiring 35, and the ground layer 70 to each other. Similarly, the ground connection via 51 electrically connects the ground layer 40, the ground wiring 31, and the ground layer 70 to each other. The ground connection via 52 electrically connects the ground layer 40, the ground wiring 32, and the ground layer 70 to each other, and the ground connection via 53 electrically connects the ground layer 40, the ground wiring 33, and the ground layer 70 to each other.

In the present embodiment, the ground connection vias 51 to 55 are filled vias formed by filling through-holes of the insulating base materials 10, 60 with conductive paste. Not limited to this, the ground connection vias 51 to 55 may be other electrical connection means (such as through-holes).

As shown in FIG. 2, the ground connection vias 51 to 55 are provided at predetermined intervals D in the longitudinal direction. In the present embodiment, the ground connection vias 51 to 55 all have the same interval D.

Note that the ground connection vias may have different intervals D from one another. For example, the ground connection vias 51 may be arranged at first intervals in the longitudinal direction, while the ground connection vias 52 may be arranged at second intervals in the longitudinal direction. In this case, both the first interval and the second interval are preferably shorter than a half wavelength of a signal flowing through the signal line 21. Thus, resonance due to the signal can be suppressed.

When relative dielectric constant of the insulating base materials 10, 60 is 3.0 to 4.0 and frequency of the signal is 15 GHz, the half wavelength ($\lambda/2$) is 5 to 5.8 mm. Therefore, in the present embodiment, a distance between the ground connection vias 51 to 55 is set to 5 mm.

Further, even when signal frequencies of the signal lines are different from each other, the resonance of each signal can be suppressed by adjusting an arrangement interval of the ground connection vias. For example, the signal line 21 is assumed to be a wiring to which the signal of frequency f1 is input. Furthermore, it is assumed that the signal line 22 is a wiring to which the signal of frequency f2 (that is, f2<f1) lower than the frequency f1 is input. In this case, the ground connection vias 51 are arranged at first intervals in the longitudinal direction, the ground connection vias 52 are arranged at second intervals in the longitudinal direction, and the ground connection vias 53 are arranged at third intervals in the longitudinal direction. The first interval and the second interval are shorter than the half wavelength of the signal of frequency f1. Then, the third interval is shorter than the half wavelength of the signal of frequency f2 and longer than the first and second intervals. For example, by thinning out and arranging the ground connection vias 53, the third interval is longer than the first and second intervals. Thus, since the number of ground connection vias is reduced, productivity of the printed wiring board 1 for high frequency transmission can be improved.

As shown in FIG. 3, the width w1 of the ground wiring 31 is smaller than a land diameter Ra of the ground connection via 51. Similarly, the widths of the ground wirings 32 to 35 are respectively smaller than land diameters Ra of the ground connection vias 52 to 55. In other words, the land diameters Ra of the ground connection vias 51 to 55 are larger than the widths of the ground interconnection vias 31 to 35. The land diameters Ra are larger than via diameters of the ground connection vias 51 to 55 by a predetermined width (a manufacturing margin or the like). In the present embodiment, as shown in FIG. 3, the land diameters Ra are equal to the widths of the thickest portions of the ground wirings 31 to 35. The land diameter Ra is, for example, 350 μm.

The land diameters Ra of the ground connection vias 51 to 55 are larger than the widths of the ground wirings 31 to 35. Therefore, as shown in FIG. 2, the signal lines 21 to 24 are slightly bypassed near the ground connection vias 51 to 55. As a result, lengths of the signal lines 21 to 24 are slightly larger than when they are linear. However, even in the present embodiment in which the ground connection vias 51 to 55 are arranged at intervals of 5 mm, an increase in the length of the signal line is within 1% as compared with the above-described comparative example. Therefore, effect on transmission loss is in a negligible range.

The ground connection vias 51 to 55 are arranged not to overlap each other in the width direction (Y direction in FIG. 2) perpendicular to the longitudinal direction not only in the region R1 but throughout the cable portion 90 of the printed wiring board 1 for high frequency transmission. Thus, reliability of the ground connection vias 51 to 55 can be maintained (that is, it is not necessary to reduce the via diameter). At the same time, the width of the printed wiring board 1 for high frequency transmission can be reduced.

Note that as shown in FIG. 2, the ground connection vias 51 to 55 may be arranged on a straight line (see an imaginary line L) in a direction obliquely intersecting the longitudinal direction. By arranging the ground connection vias 51 to 55 obliquely shifted in this manner, the width of the printed wiring board 1 for high frequency transmission can be more effectively reduced.

As described above, in the printed wiring board 1 for high frequency transmission according to the present embodiment, the widths of the ground wirings 31 to 35 are smaller than the land diameters of the around connection vias 51 to 55. Then, the ground connection vias 51 to 55 are arranged not to overlap each other in the width direction of the printed wiring board 1 for high frequency transmission throughout the cable portion 90. Thus, according to the present embodiment, it is possible to reduce the width of the printed wiring board 1 for high frequency transmission (cable portion 90) while maintaining reliability of the ground connection vias 51 to 55.

Further, according to the present embodiment, unlike a typical thin coaxial cable, a space in the information processing terminal is not pressed even if the number of signal lines is increased as the number of antennas is increased. Therefore, it is possible to easily deal with increase in the number of antennas. Further, even when the number of signal lines is increased, it is possible to suppress increase in the width of the printed wiring board 1 for high frequency transmission.

Method for Manufacturing Printed Wiring Board for High Frequency Transmission

Next, an example of a method for manufacturing the printed wiring board 1 for high frequency transmission will be described with reference to process cross-sectional views of FIGS. 5(1) to 9. Note that the printed wiring board for high frequency transmission according to the present embodiment is not limited to the printed wiring board manufactured by the following manufacturing methods.

First, the method for manufacturing a first wiring base material (wiring base material 2) will be described with reference to FIGS. 5(1) to 6(2).

Figure 5:
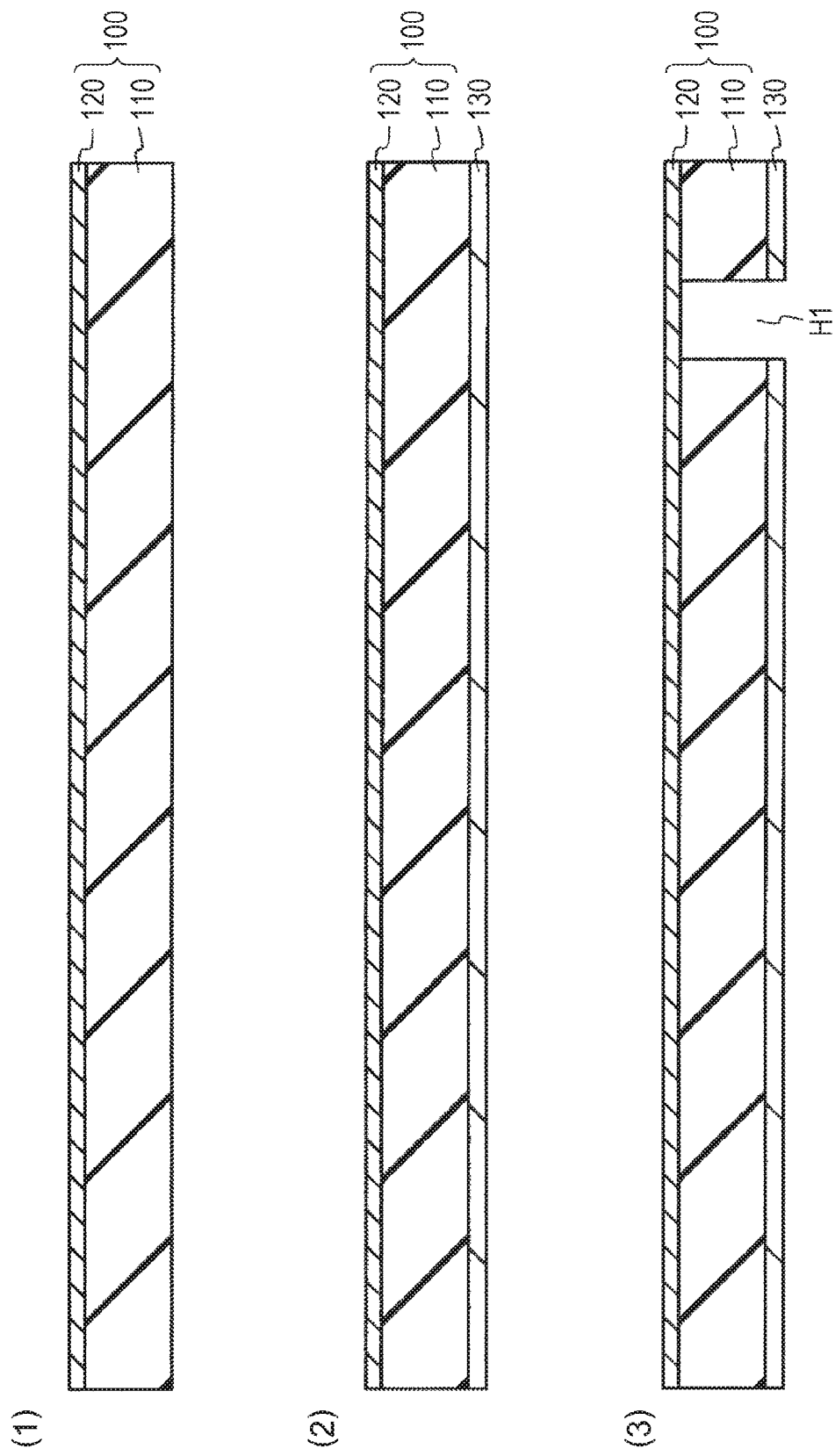
FIGS. 5(1) to 5(3) are process cross-sectional views for describing a method for manufacturing the printed wiring board for high frequency transmission according to the first embodiment.

As shown in FIG. 5(1), a single-sided metal foil-clad laminate 100 having an insulating base material 110 and a metal foil 120 provided on one side of the insulating base material 110 is prepared. The insulating base material 110 is an insulating film (for example, 100 μm thick) made of a liquid crystal polymer or the like. The metal foil 120 is, for example, a copper foil (for example, 12 μm thick). Note that the metal foil 120 may be a metal foil made of a metal (silver, aluminum, or the like) other than copper.

Next, as shown in FIG. 5(2), an adhesive protective film 130 is bonded to the insulating base material 110 of the single-sided metal foil-clad laminate 100 such that a slightly adhesive layer is in contact with the insulating base material 110. The adhesive protective film 130 has the slightly adhesive layer formed on one side of the insulating film made of PET or the like.

Next, as shown in FIG. 5(3), the adhesive protective film 130 and the insulating base material 110 are partially removed by irradiation with a laser pulse. Thus, a bottomed via hole H1 having the metal foil 120 exposed at its bottom is formed. A diameter of the bottomed via hole H1 is, for example, 150 μmφ. For example, an infrared laser such as a carbon dioxide gas laser, or a UV-YAG laser is used for laser processing.

After laser pulse irradiation, resin residue at a boundary between the insulating base material 110 and the metal foil 120 and a treated film (for example, Ni/Cr film) on a back surface of the metal foil 120 are removed by performing desmear process.

Figure 6:
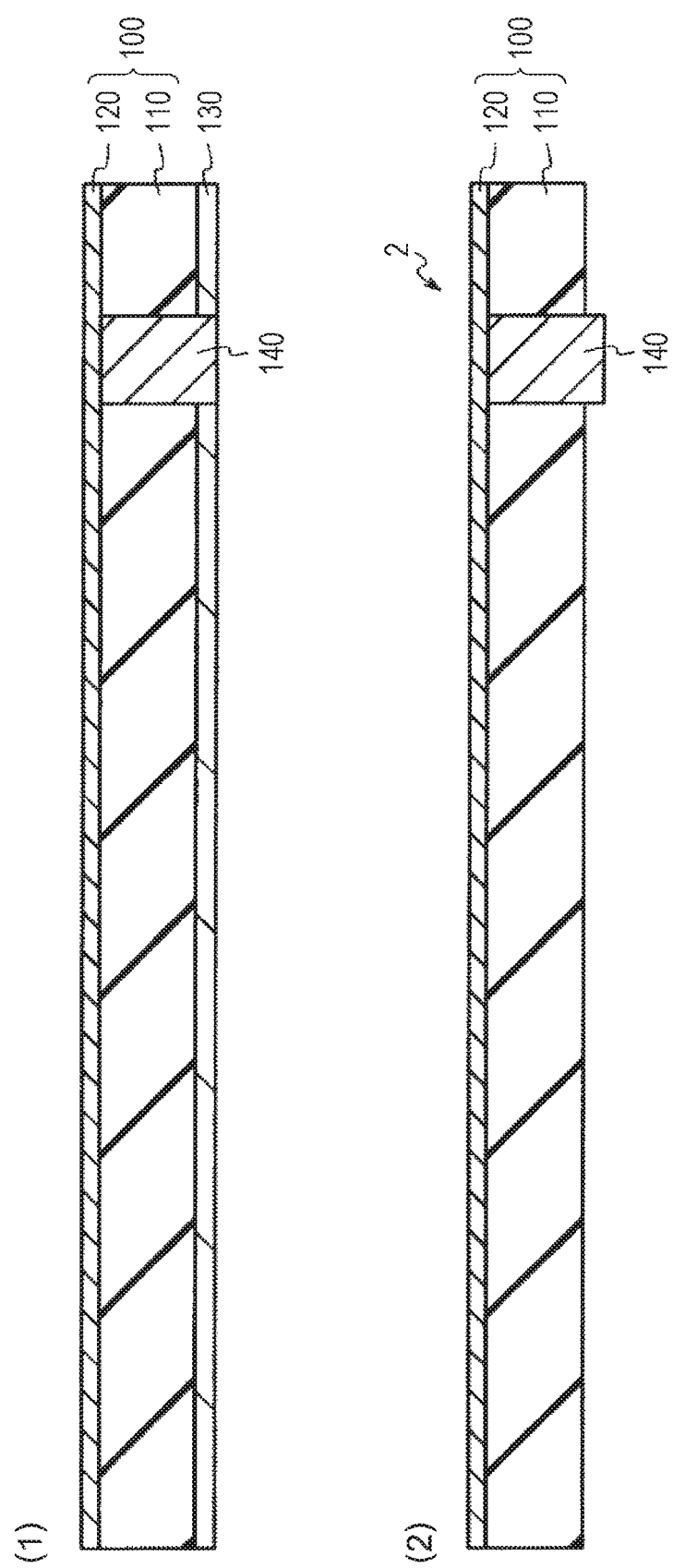
FIGS. 6(1) and 6(2) are process cross-sectional views for describing the method for manufacturing the printed wiring board for high frequency transmission according to the first embodiment following FIGS. 5(1) to 5(3).

Next, as shown in FIG. 6(1), the bottomed via hole H1 is filled with conductive paste 140. More specifically, the bottomed via hole H1 is filled with the conductive paste 140 using the adhesive protective film 130 as a printing mask by a printing method such as screen printing. Here, the conductive paste 140 is obtained by dispersing metal particles in a paste-like thermosetting resin as a resin binder.

Next, as shown in FIG. 6(2), the adhesive protective film 130 is peeled off from the insulating base material 110. Thus, a part of the conductive paste 140 filling the bottomed via hole H1 projects from the insulating base material 110. The wiring base material 2 shown in FIG. 6(2) is obtained by steps up to this point.

A method for manufacturing a second wiring base material (wiring base material 3) will be described with reference to FIGS. 7(1) to 8(3).

As shown in FIG. 7(1), a double-sided metal foil-clad laminate 200 having an insulating base material 210 and metal foils 220 and 230 provided on both sides of the insulating base material 210 is prepared. The insulating base material 210 is the insulating film (for example, 100 μm thick) made of a liquid crystal polymer or the like. The metal foils 220, 230 are, for example, copper foils (for example, 12 μm thick). Note that the metal foils 220, 230 may be metal foils made of metals (silver, aluminum, or the like) other than copper.

Next, as shown in FIG. 7(2), wirings 221 to 229 are formed by patterning the metal foil 220 on the double-sided metal foil-clad laminate 200 by a known photofabrication method. The wirings 221, 223, 225, 227, 229 serve as the ground wirings. The wirings 222, 224, 226, 228 serve as the signal lines. Compared with FIG. 4, wirings 121, 123, 125, 127, 129 respectively correspond to the ground wirings 31, 32, 33, 34, 35. Then, the wirings 122, 124, 126, 128 respectively correspond to the signal lines 21, 22, 23, 24.

Note that the ground layer may be formed only on a partial region of a lower surface of the insulating base material 210 by patterning the metal foil 230. Or, the metal foil 230 may be processed into a predetermined shape such as a mesh shape.

Next, as shown in FIG. 7(3), an adhesive layer 240 in which the wirings 221 to 229 are embedded is formed. For example, a low flow bonding sheet (for example, 15 μm thick) is laminated on the insulating base material 210. Thereafter, a protective film 250 is laminated on the adhesive layer 240. For example, the protective film (for example, 20 μm thick) made of PET or the like is bonded to the adhesive layer 240.

Figure 8:
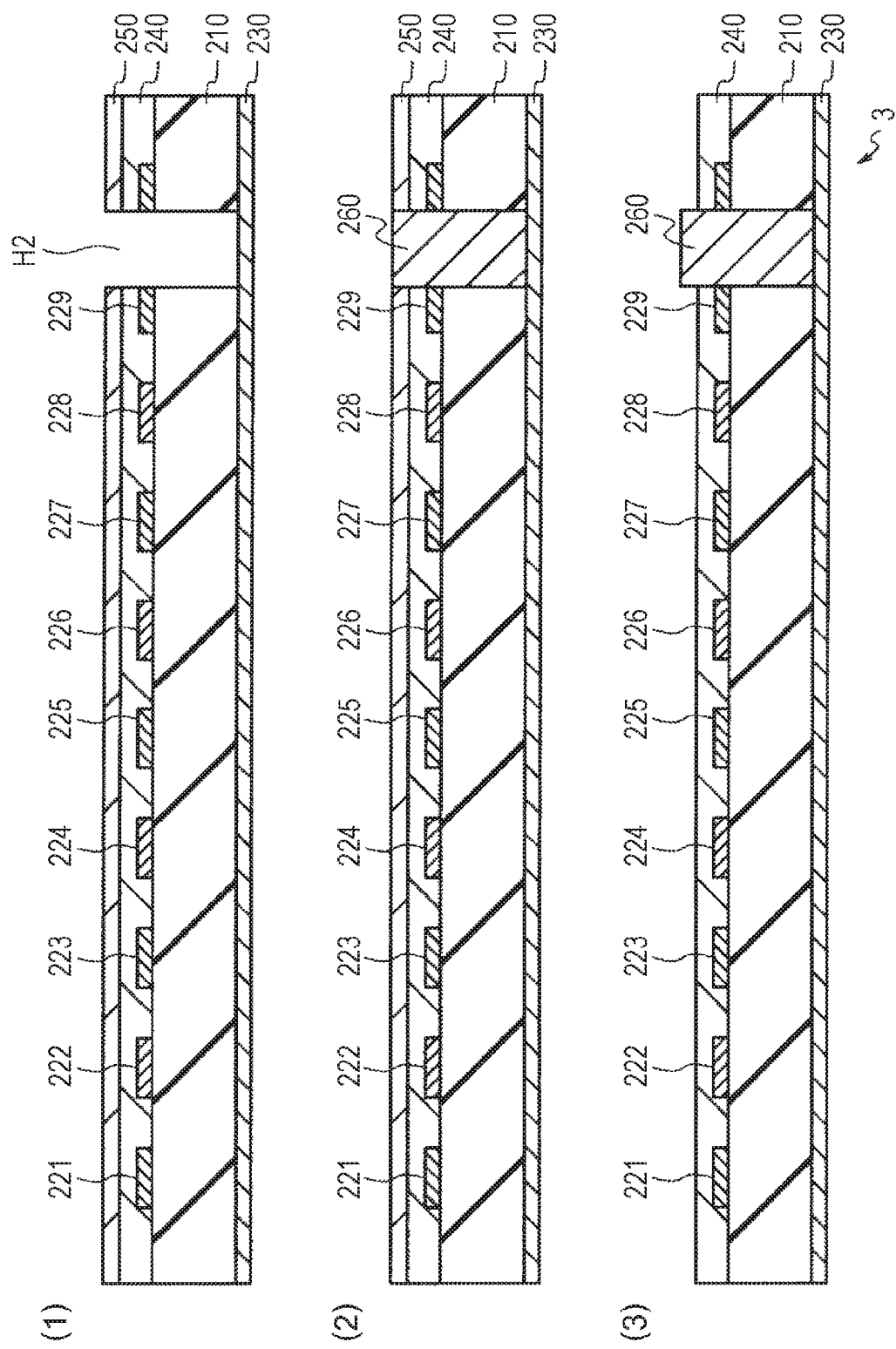
FIGS. 8(1) to 8(3) are process cross-sectional views for describing the method for manufacturing the printed wiring board for high frequency transmission according to the first embodiment following FIGS. 7(1) to 7(3).

Next, as shown in FIG. 8(1), the protective film 250, the adhesive layer 240, the wiring 229, and the insulating base material 210 are partially removed by irradiation with the laser pulse. Thus, a bottomed via hole H2 having the metal foil 230 exposed at the bottom is formed. The diameter of the bottomed via hole H2 is, for example, 150 μmφ. Thereafter, the desmear process is performed as in the case of the bottomed via hole H1.

Next, as shown in FIG. 8(2), the bottomed via hole H2 is filled with conductive paste 260. As a method for filling the conductive paste, the same method as that of the bottomed via hole H1 can be used.

Next, as shown in FIG. 8(3), the protective film 250 is peeled off from the adhesive layer 240. Thus, a part of the conductive paste 260 filling the bottomed via hole H2 projects from the adhesive layer 240. The wiring base material 3 shown in FIG. 8(3) is obtained by the steps up to this point.

Figure 9:
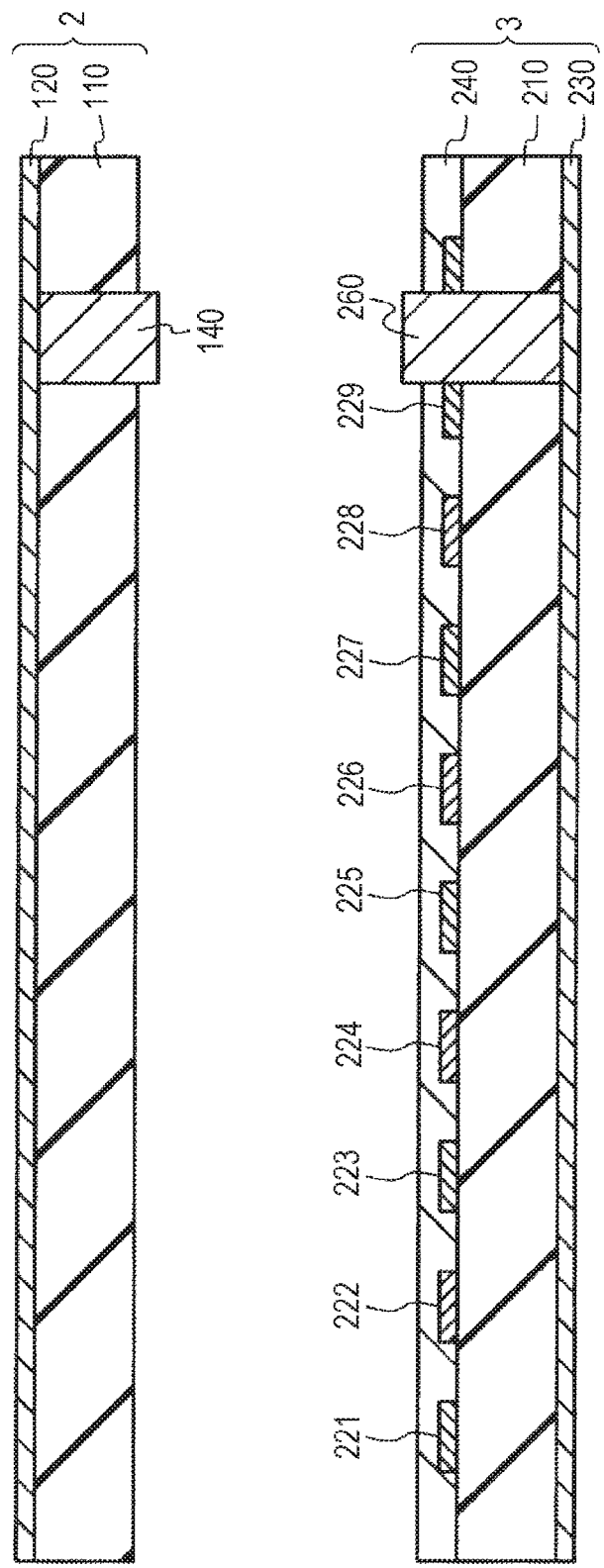
FIG. 9 is a process cross-sectional view for describing the method for manufacturing the printed wiring board for high frequency transmission according to the first embodiment following FIGS. 8(1) to 8(3).

After the wiring base materials 2 and 3 are produced, as shown in FIG. 9, the wiring base material 2 and the wiring base material 3 are opposed to each other, so that the two members are aligned with each other. The wiring base material 2 and the wiring base material 3 are laminated such that a tip of the conductive paste 140 and a tip of the conductive paste 260 are in contact with each other.

Next, the laminated wiring base material 2 and the wiring base material 3 are heated and pressurized. Thus, the wiring base material 2 and the wiring base material 3 are integrated together. At the time of heating, thermosetting of binder resin of the conductive pastes 140, 260 is completed. Thus, the ground connection via having ground wirings electrically connected to the ground layers on the both sides are formed. Thereafter, surface treatment of a wiring layer exposed to the outside, formation of a surface protective film, outer shape processing, and the like are performed. It is possible to form a thin cable portion 90 by performing the outer shape processing by using the laser.

Next, two modifications of the printed wiring board 1 for high frequency transmission will be described. The same effect as that of the first embodiment can be obtained by any of the modifications.

Modification 1

Figure 10:
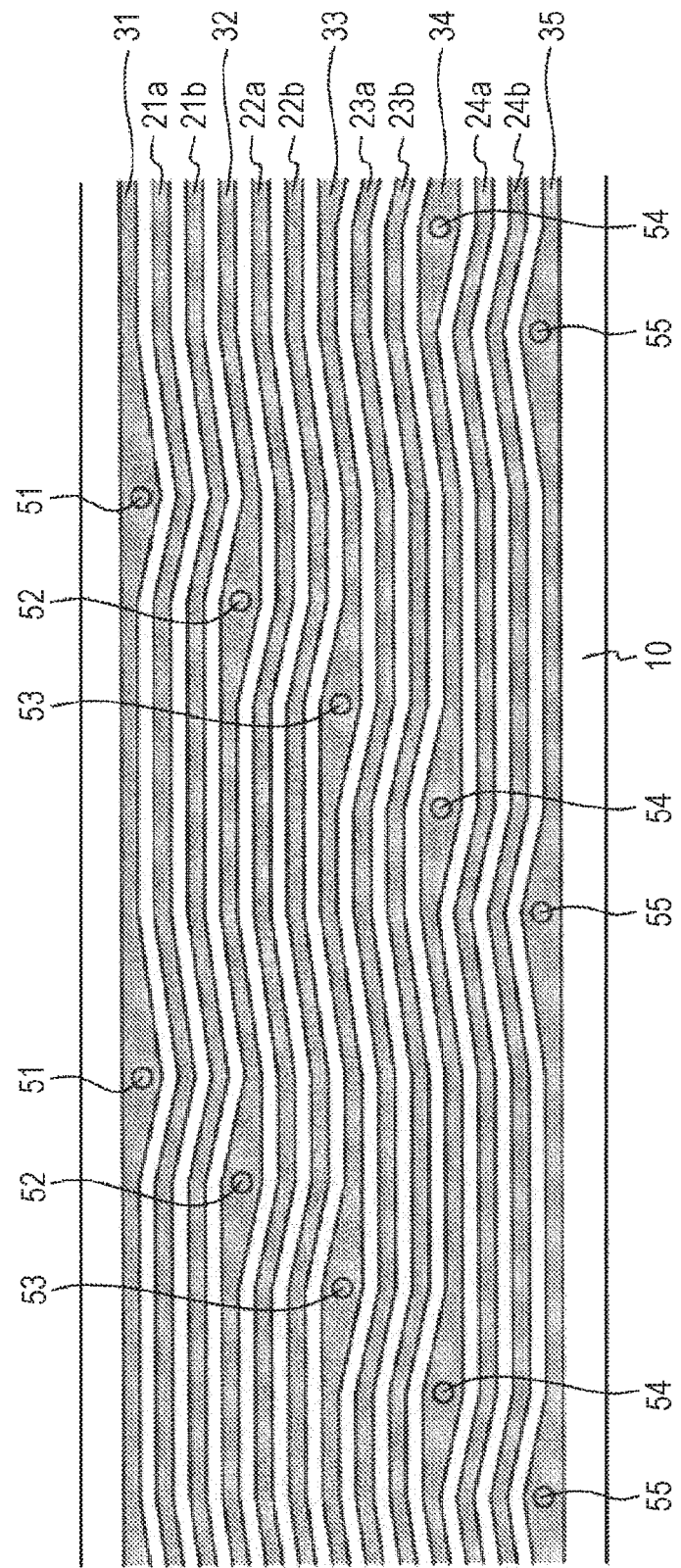
FIG. 10 is a plan view of a part of the printed wiring board for high frequency transmission according to a modification 1 of the first embodiment.

In the present modification, the signal line is configured to function as a differential line. That is, as shown in FIG. 10, the printed wiring board 1 for high frequency transmission according to the present modification has a plurality of sets of signal lines functioning as differential lines, that is, signal lines 21a, 21b, signal lines 22a, 22b, signal lines 23a, 23b, and signal lines 24a, 24b.

The signal in reverse phase to the signal input to the signal line 21a is input to the signal line 21h. The signal line 21b is formed between the signal line 21a and the ground wiring 32 on the major surface 10a, of the insulating base material 10, and extends in the longitudinal direction at a first distance from the signal line 21a, and at a second distance from the ground wiring 32. The first and second distances are, for example, 150 μm. The signal lines 22b, 23b, 24b extend in the same manner. The signals in reverse phase to the signals input to the signal lines 22a, 23a, 24a are respectively input to the signal lines 22b, 23b, 24b.

Modification 2

In the present modification, the transmission line of single end structure and the differential line are mixed. In the printed wiring board 1 for high frequency transmission according to the present modification, as shown in FIG. 11, two sets of signal lines 21a, 21b and signal lines 22a, 22b functioning as the differential lines, and the signal line 23 and the signal line 24 which are the transmission lines of the single end structure are provided.

Figure 11:
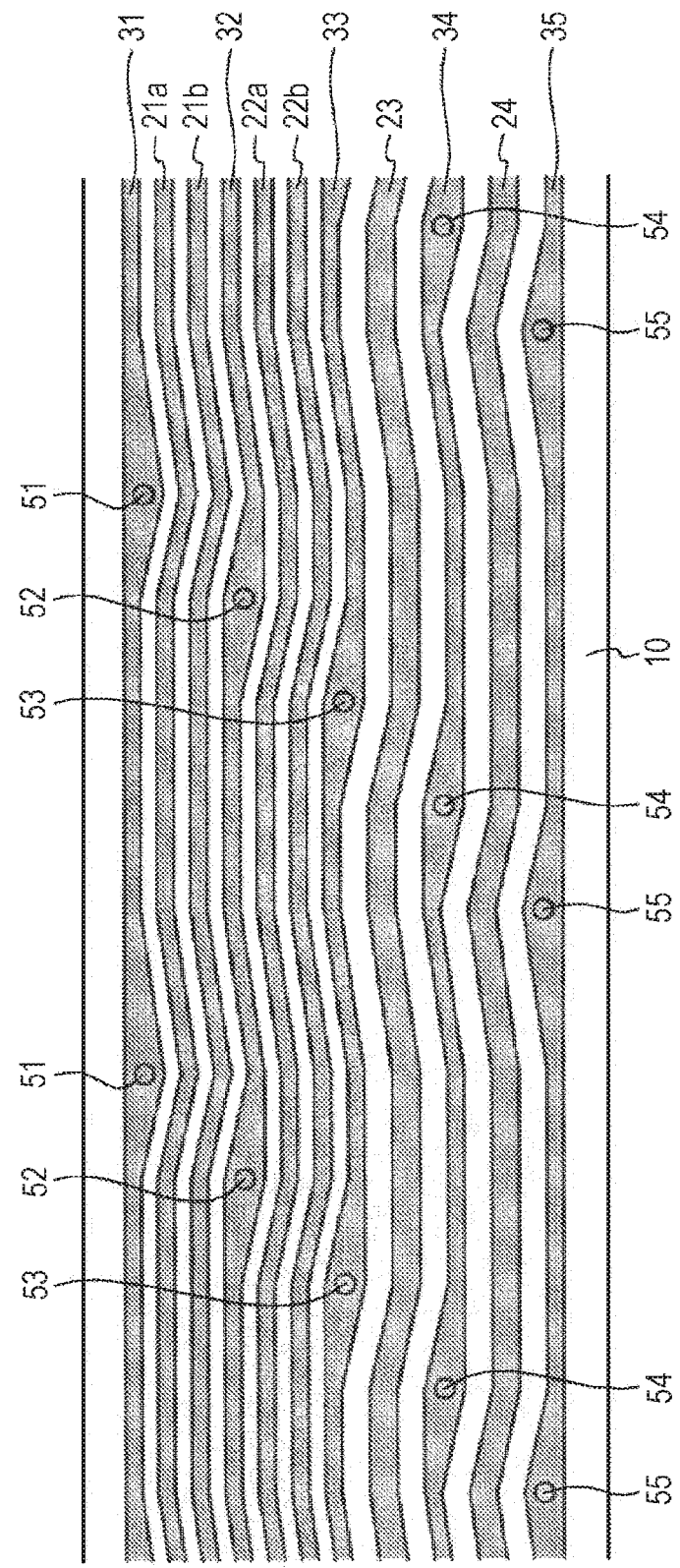
FIG. 11 is a partial plan view of the printed wiring board for high frequency transmission according to a modification 2 of the first embodiment.

Note that arrangement of the transmission lines of the single end structure and the differential lines is not limited to an example shown in FIG. 11. Other arrangements may be employed as appropriate. For example, the transmission lines of the single end structure and the differential lines may be alternately arranged with the ground wirings interposed therebetween.

Second Embodiment

The printed wiring board for high frequency transmission according to a second embodiment of the present disclosure will be described. One of differences between the second embodiment and the first embodiment is that the ground layer is formed only on one side in the second embodiment.

The shapes of the signal lines and the ground wiring are the same as in the first embodiment. That is, the width of the ground wiring is smaller than the land diameter of the ground connection via. Further, the ground connection vias of the ground wirings are arranged not to overlap each other in the width direction of the printed wiring board for high frequency transmission throughout the cable portion.

Hereinafter, an example of the method for manufacturing the printed wiring board for high frequency transmission according to the present embodiment will be described with reference to the process cross-sectional views of FIGS. 12(1) to 15. Note that the printed wiring board for high frequency transmission according to the present embodiment is not limited to the printed wiring board manufactured by the following manufacturing methods.

The wiring base material 2 is produced by the method described in the first embodiment.

Figure 12:
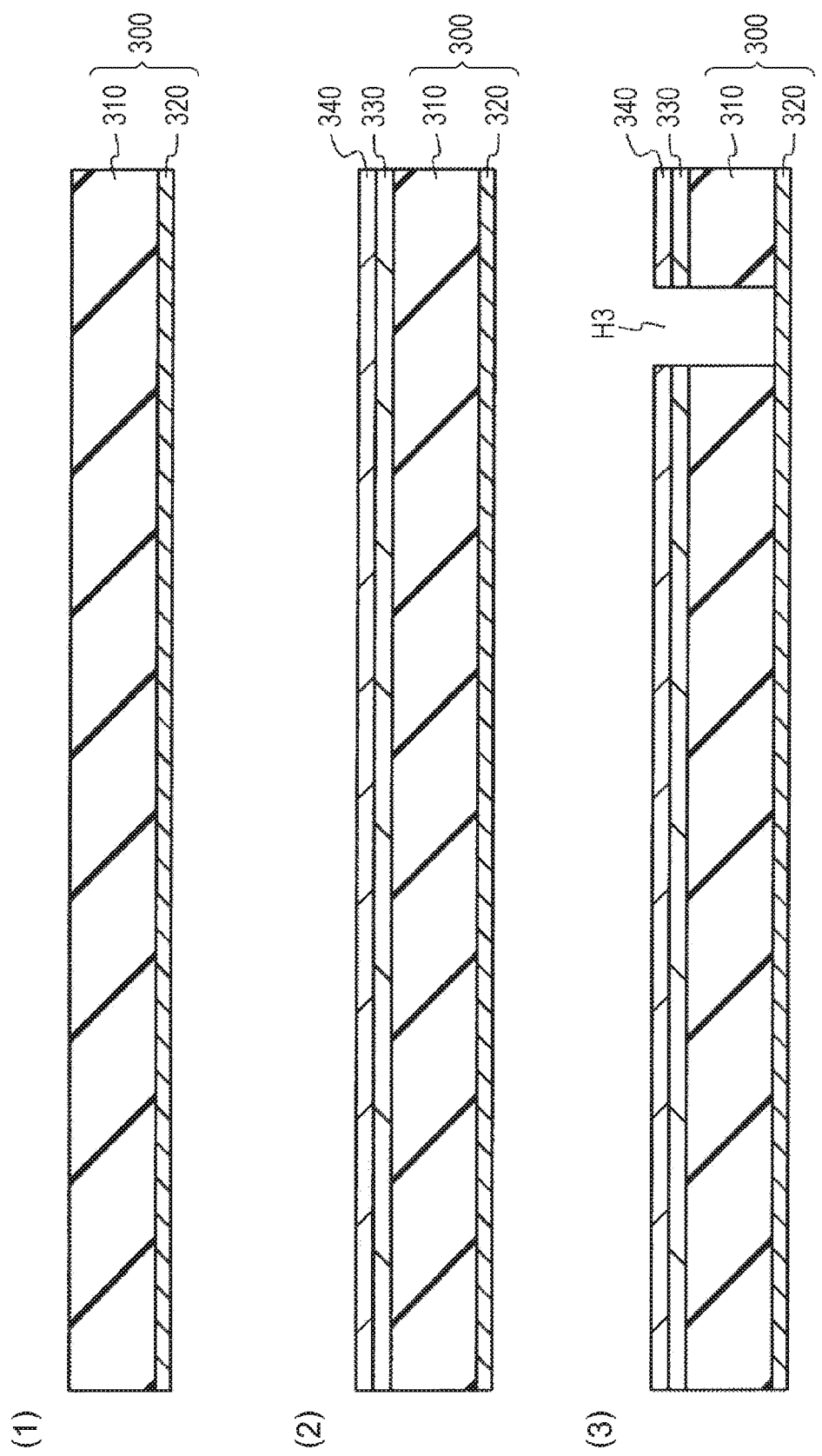
FIGS. 12(1) to 12(3) are process cross-sectional views for describing the method for manufacturing the printed wiring board for high frequency transmission according to the second embodiment.

Next, as shown in FIG. 12(1), a single-sided metal foil-clad laminate 300 having an insulating base material 310 and a metal foil 320 provided on one side of the insulating base material 310 is prepared. The insulating base material 310 is the insulating film (for example, 100 μm thick) made of a liquid crystal polymer or the like. The metal foil 320 is, for example, the copper foil (for example, 12 μm thick). Note that the metal foil 320 may be the metal foil made of the metal (silver, aluminum, or the like) other than copper.

Next, as shown in FIG. 12(2) adhesive layer 330 is formed on the insulating base material 310. For example, the low flow bonding sheet (for example, 15 μm thick) is laminated on the insulating base material 310. Thereafter, a protective film 340 is laminated on the adhesive layer 330. For example, the protective film (for example, 20 μm thick) made of PET or the tike is bonded to the adhesive layer 330.

Next, as shown in FIG. 12(3), the protective film 340, the adhesive layer 330, and the insulating base material 310 are partially removed by irradiation with the laser pulse. Thus, a bottomed via hole 1-13 having the metal foil 320 exposed at the bottom is formed. The diameter of the bottomed via hole 1-13 is, for example, 150 μmφ. Thereafter, the d smear process is performed as in the case of the bottomed via holes H1, H2.

Figure 13:
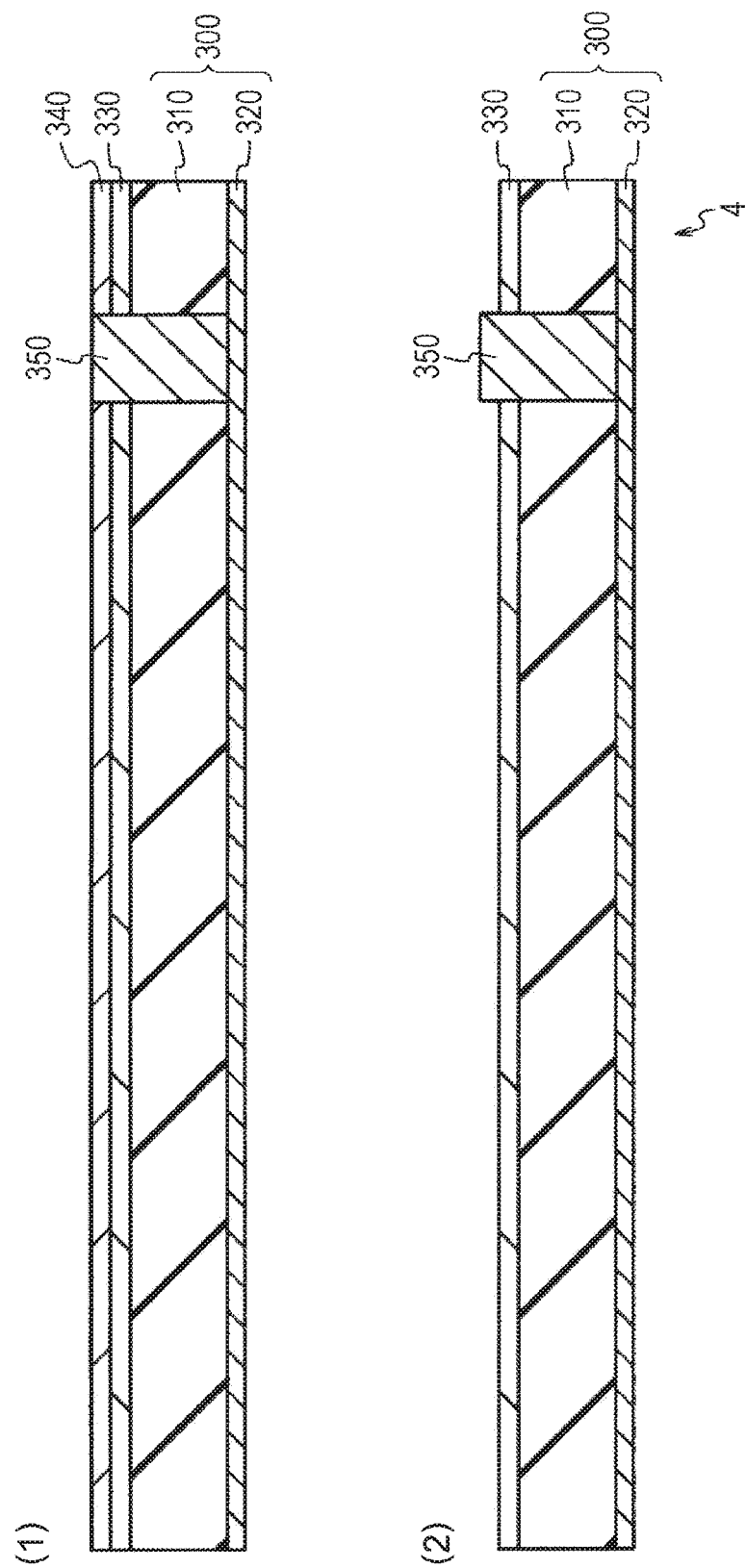
FIGS. 13(1) and 13(2) are process cross-sectional views for describing the method for manufacturing the printed wiring board for high frequency transmission according to the second embodiment following FIGS. 12(1) to 12(3).

Next, as shown in FIG. 13(1), the bottomed via hole H3 is filled with conductive paste 350. As the method for filling the conductive paste, the same method as that of the bottomed via holes H1, H2 can be used.

Next, as shown in FIG. 13(2), the protective film 340 is peeled off from the adhesive layer 330. Thus, a part of the conductive paste 350 filling the bottomed via hole H3 projects from the adhesive layer 330. By the steps up to this point, a wiring base material 4 shown in FIG. 13(2) is obtained.

Figure 14:
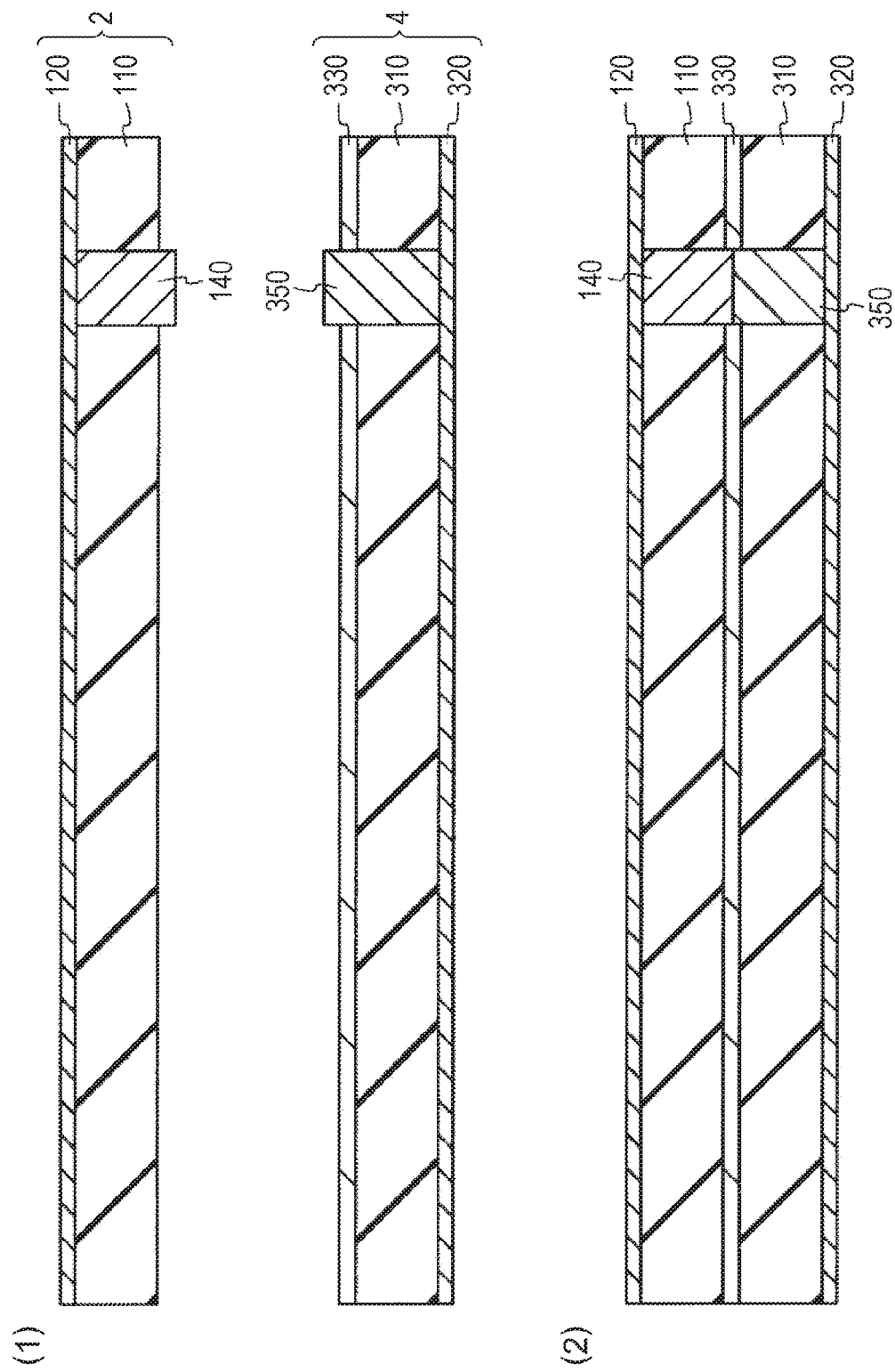
FIGS. 14(1) and 14(2) are process cross-sectional views for describing the method for manufacturing the printed wiring board for high frequency transmission according to the second embodiment following FIGS. 13(1) and 13(2).

After the wiring base materials 2 and 4 are manufactured, as shown in FIGS. 14(1) and 14(2), the wiring base material 2 and the wiring base material 4 are opposed to each other, so that the two members are aligned with each other. The wiring base material 2 and the wiring base material 4 are laminated such that the tip of the conductive paste 140 and the tip of the conductive paste 350 are in contact with each other.

Next, the laminated wiring base material 2 and the wiring base material 4 are heated and pressurized. Thus, the wiring base material 2 and the wiring base material 4 are integrated together. At the time of heating, thermosetting of the binder resin of the conductive pastes 140, 350 is completed. Thus, the ground connection via having the ground wiring electrically connected to the ground layer on one side is formed.

Figure 15:
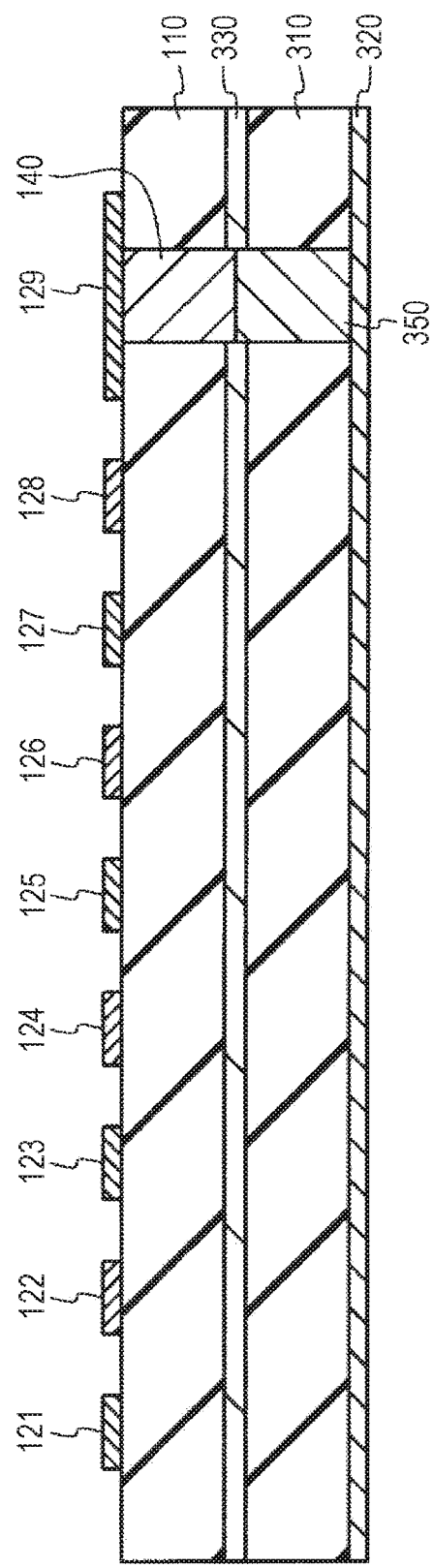
FIG. 15 is a cross-sectional view of the printed wiring board for high frequency transmission according to the second embodiment.
Figure 16:
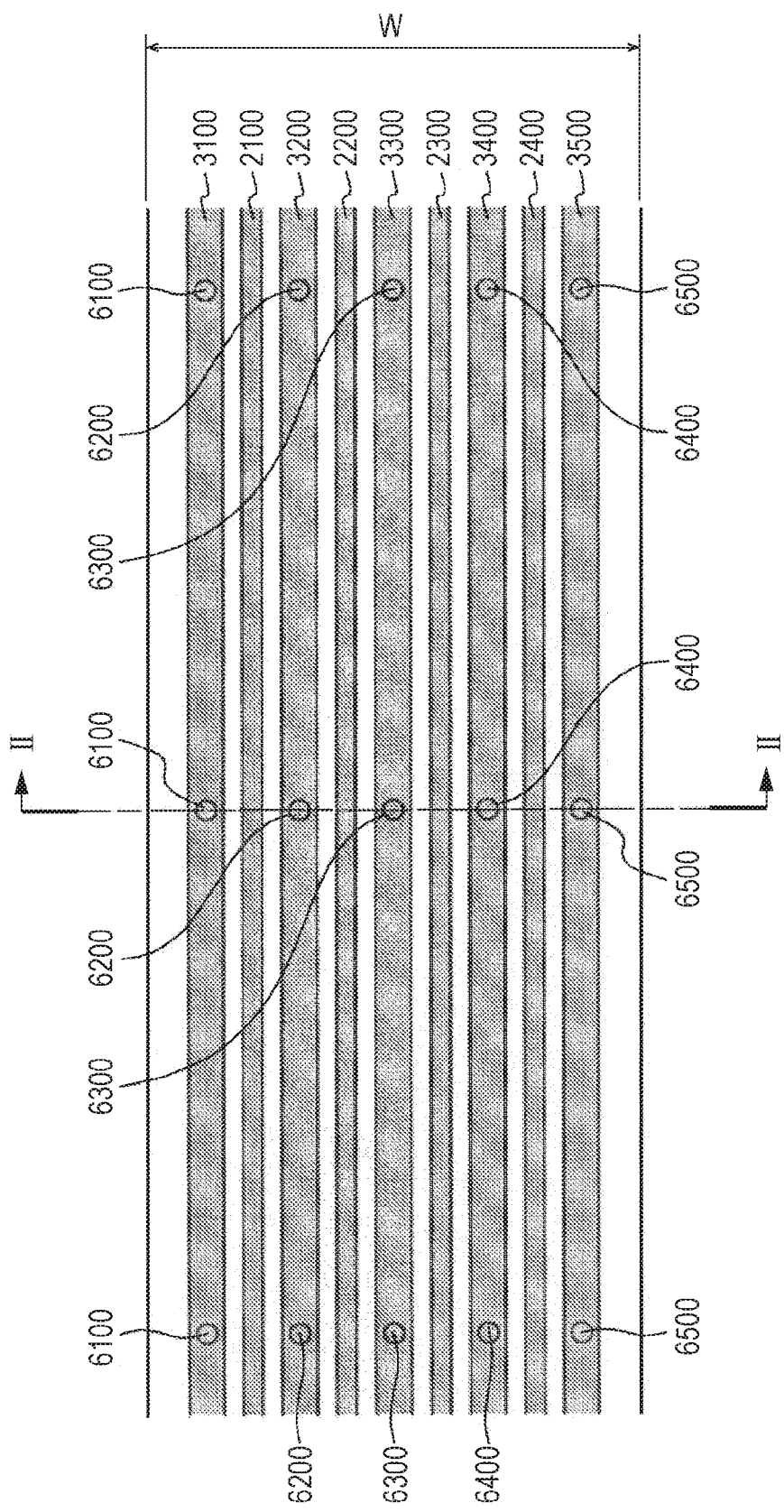
FIG. 16 is a partial plan view of the printed wiring board for high frequency transmission according to a comparative example.
Figure 17:
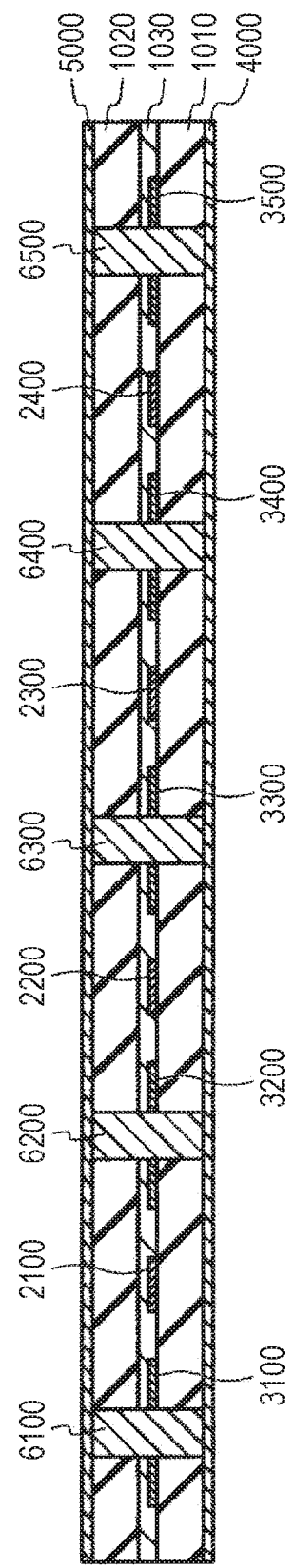
FIG. 17 is a cross-sectional view taken along line II-II in FIG. 16.

Next, as shown in FIG. 15, the metal foil 120 is patterned by the known photofabrication method. Thus, the wirings 121 to 129 are formed. The wirings 121, 123, 125, 127, 129 respectively correspond to the ground wires 31, 32, 33, 34, 35 in FIG. 2. The wirings 122, 124, 126, 128 respectively correspond to the signal lines 21, 22, 23, 24 in FIG. 2. Thereafter, surface treatment of the wiring layer exposed to the outside, formation of the surface protective film, and outer shape processing are performed.

Note that a ground layer may be formed only on a partial region of the lower surface of the insulating base material 310 by patterning the metal foil 320. Or, the metal foil 320 may be processed into a predetermined shape such as a mesh shape. Further, after the signal line and the ground wiring are formed by patterning the metal foil 320, the metal foil 120 may be processed into the ground layer.

Also in the second embodiment, the width of the ground wiring is smaller than the land diameter of the ground connection via. Further, the ground connection vias of the ground wirings are arranged not to overlap each other in the width direction of the printed wiring board for high frequency transmission throughout the cable portion. Therefore, it is possible to reduce the width of the printed wiring board (cable portion) for high frequency transmission while maintaining reliability of the ground connection vias as in the first embodiment.

The embodiments and the modifications of the printed wiring board for high frequency transmission according to the present embodiment have been described above. Application of the printed wiring board for high frequency transmission according to the present embodiment is not limited to connection between the antenna and the substrate. The printed wiring board for high frequency transmission according to the present embodiment is applicable to other uses as the printed wiring board for transmitting high frequency signals.

Based on the above description, those skilled in the art can easily conceive of additional effects and various modifications of the present embodiment. However, the present embodiment is not limited to the individual embodiments described above. Components employed in different embodiments can be combined as appropriate. Various additions, modifications, and partial deletions can be made to these embodiments without departing from the conceptual idea and spirit derived from these embodiments and their equivalents.

LIST OF REFERENCE NUMERALS

1 Printed wiring board for high frequency transmission
2, 3, 4 Wiring base material 10, 60, 110, 210 Insulating base material
21, 22, 23, 24 Signal line
31, 32, 33, 34 Ground wiring
40, 70 Ground layer
51, 52, 53, 54, 55 Ground connection via
80 Adhesive layer
90 Cable portion
95 Connector portion
96, 97 Connection pin
130 Adhesive protective film
140 Conductive paste
1010, 1020 Insulating base material
1030 Adhesive layer
2100, 2200, 2300, 2400 Signal line
3100, 3200, 3300, 3400, 3500 Ground wiring
4000, 5000 Ground layer
6100, 6200, 6300, 6400, 6500 Ground connection via
H1, H2, H3 Bottomed via hole
D Interval
L Imaginary line
R1, R2 Region
Ra Land diameter

The invention claimed is:

1. A printed wiring board for high frequency transmission, comprising:
   an insulating base material having a first major surface and a second major surface opposite to the first major surface, and extending in a longitudinal direction thereof;
   a plurality of signal lines formed on the first major surface and extending in the longitudinal direction, the plurality of signal lines including a first signal line;
   a first ground wiring formed on the first major surface and extending in the longitudinal direction while being spaced apart from each one of the plurality of signal lines by a respective predetermined distance;
   a second ground wiring formed on an opposite side of the first ground wiring with the first signal line interposed therebetween on the first major surface, and extending in the longitudinal direction while being spaced apart from the first signal line by a predetermined distance;
   a ground layer formed on the second major surface;
   a plurality of first ground connection vias electrically connecting the first ground wiring and the ground layer; and
   a plurality of second ground connection vias electrically connecting the second ground wiring and the ground layer, wherein
   a width of the first ground wiring is smaller than a land diameter of the first ground connection vias,
   a width of the second ground wiring is smaller than a land diameter of the second ground connection vias, and
   the first ground connection vias and the second ground connection vias are arranged not to overlap each other in a width direction perpendicular to the longitudinal direction throughout a cable portion.

2. The printed wiring board for high frequency transmission according to claim 1, wherein
   the plurality of first ground connection vias are arranged at first intervals in the longitudinal direction,
   the plurality of second ground connection vias are arranged at second intervals in the longitudinal direction, and
   the first interval and the second interval are shorter than a half wavelength of a signal flowing through the first signal line.

3. The printed wiring board for high frequency transmission according to claim 1, further comprising
   a second signal line of the plurality of signal lines formed between the first signal line and the second ground wiring on the first major surface, and extending in the longitudinal direction while being spaced apart from the first signal line by a first distance and spaced apart from the second ground wiring by a second distance, wherein
   a signal in reverse phase to a signal input to the first signal line is input to the second signal line.

4. The printed wiring board for high frequency transmission according to claim 1, further comprising:
   a second insulating base material having a third major surface, and a fourth major surface opposite to the third major surface, extending in the longitudinal direction, and bonded to the insulating base material through an adhesive layer so that the third major surface faces the first major surface; and
   a second ground layer formed on the fourth major surface, wherein
   the first ground connection via electrically connects the first ground wiring and the second ground layer, and
   the second ground connection via electrically connects the second ground wiring and the second ground layer.

5. The printed wiring board for high frequency transmission according to claim 1, wherein the insulating base material has flexibility.

6. The printed wiring board for high frequency transmission according to claim 5, wherein the insulating base material comprises a liquid crystal polymer.

7. The printed wiring board for high frequency transmission according to claim 1, further comprising a connector portion having a first connection pin electrically connected to the first signal line, and a second connection pin electrically connected to the first and second ground wirings, and provided at an end of the cable portion.

8. The printed wiring board for high frequency transmission according to claim 7, wherein a width of the connector portion is larger than that of the insulating base material.

9. The printed wiring board for high frequency transmission according to claim 1, wherein each of the first plurality of signal lines is alternately arranged between each of a pair of adjacent first ground wiring.

10. The printed wiring board for high frequency transmission according to claim 1, wherein the cable portion includes a plurality of ground connection vias that includes the plurality of first ground connection vias, and the plurality of second ground connection vias, and the plurality of ground connection vias are arranged to not overlap each other in the width direction.

11. The printed wiring board for high frequency transmission according to claim 1, wherein the cable portion includes a plurality of ground connection vias extending in the width direction, each of the plurality of ground connection vias positioned on a respective land, and each of the respective lands is offset longitudinally with respect to all other lands on the cable portion.

12. The printed wiring board for high frequency transmission according to claim 1, including a plurality of ground wirings extending across a width of the cable portion that includes the first ground wiring and the second ground wiring, each of the plurality of ground wirings including a ground connection via, and the plurality of ground connection vias are positioned such that an oblique imaginary line can be drawn through a center of one ground connection via in each one of the plurality of ground wirings.

13. A printed wiring board for high frequency transmission, further comprising:
- an insulating base material having a first major surface and a second major surface opposite to the first major surface, and extending in a longitudinal direction thereof;
- a first signal line formed on the first major surface and extending in the longitudinal direction;
- a first ground wiring formed on the first major surface and extending in the longitudinal direction while being spaced apart from the first signal line by a predetermined distance;
- a second ground wiring formed on an opposite side of the first ground wiring with the first signal line interposed therebetween on the first major surface, and extending in the longitudinal direction while being spaced apart from the first signal line by a predetermined distance;
- a second signal line formed on an opposite side of the first signal line with the second ground wiring interposed therebetween on the first major surface, and extending in the longitudinal direction while being spaced apart from the second ground wiring by a predetermined distance;
- a ground layer formed on the second major surface;
- a plurality of first ground connection vias electrically connecting the first ground wiring and the ground layer;
- a plurality of second ground connection vias electrically connecting the second ground wiring and the ground layer;
- a third ground wiring formed on an opposite side of the second ground wiring with the second signal line interposed therebetween on the first major surface, extending in the longitudinal direction while being spaced apart from the second signal line by a predetermined distance; and
- a plurality of third ground connection vias electrically connecting the third ground wiring and the ground layer, wherein
- a width of the first ground wiring is smaller than a land diameter of the first ground connection vias,
- a width of the second ground wiring is smaller than a land diameter of the second ground connection vias,
- the first ground connection vias and the second ground connection vias are arranged not to overlap each other in a width direction perpendicular to the longitudinal direction throughout a cable portion,
- a width of the third ground wiring is smaller than a land diameter of the third ground connection vias, and
- the first to third ground connection vias are arranged not to overlap each other in the width direction perpendicular to the longitudinal direction throughout the cable portion.

14. The printed wiring board for high frequency transmission according to claim 13, wherein a via region of the second ground wiring has a planar shape having one set of sides in the longitudinal direction and another set of sides in a direction intersecting the longitudinal direction.

15. The printed wiring board for high frequency transmission according to claim 13, wherein the first to third ground connection vias are arranged in a straight line in a direction obliquely intersecting the longitudinal direction.

16. The printed wiring board for high frequency transmission according to claim 13, wherein
- a signal of a first frequency is input to the first signal line,
- a signal of a second frequency lower than the first frequency is input to the second signal line,
- the plurality of first ground connection vias are arranged at first intervals in the longitudinal direction,
- the plurality of second ground connection vias are arranged at second intervals in the longitudinal direction,
- the plurality of third ground connection vias are arranged at third intervals in the longitudinal direction,
- the first interval and the second interval are shorter than a half wavelength of the signal of the first frequency, and
- the third interval is shorter than a half wavelength of the signal of the second frequency and longer than the first and second intervals.

17. The printed wiring board for high frequency transmission according to claim 13, wherein each of the first plurality of signal lines is alternately arranged between each of a pair of adjacent first ground wiring.

18. A printed wiring board for high frequency transmission, comprising:
- a pair of insulating base materials respectively having a first major surface and a second major surface opposite to the first major surface, and extending in a longitudinal direction thereof, each of the first major surfaces of each of the insulating base materials being bounded through an adhesive layer;
- a first signal line formed on the first major surface of each of the insulating base materials and extending in the longitudinal direction;
- a first ground wiring formed on the first major surface of each of the insulating base materials and extending in the longitudinal direction while being spaced apart from each one of the plurality of signal lines the first signal line by a respective predetermined distance;
- a second ground wiring formed on an opposite side of the first ground wiring with the first signal line interposed therebetween on the first major surface, and extending in the longitudinal direction while being spaced apart from the first signal line by a predetermined distance;
- a ground layer formed on the second major surface of each of the insulating base materials;
- a plurality of first ground connection vias electrically connecting the first ground wiring and the ground layer; and
- a plurality of second ground connection vias electrically connecting the second ground wiring and the ground layer, wherein
- a width of the first ground wiring is smaller than a land diameter of the first ground connection vias,
- a width of the second ground wiring is smaller than a land diameter of the second ground connection vias, and
- the first ground connection vias and the second ground connection vias are arranged not to overlap each other in a width direction perpendicular to the longitudinal direction throughout a cable portion.

* * * * *